United States Patent [19]
Lahiri

[11] Patent Number: 5,901,081
[45] Date of Patent: May 4, 1999

[54] CIRCUIT AND METHOD FOR PRECONDITIONING MEMORY WORD LINES ACROSS WORD LINE BOUNDARIES

[75] Inventor: Jayanta K. Lahiri, Bangalore, India

[73] Assignee: Texas Instruments Incorporated, Dallas, Tex.

[21] Appl. No.: 08/993,875

[22] Filed: Dec. 18, 1997

[51] Int. Cl.[6] .............................. G11C 11/34; G11C 7/00; G11C 8/00
[52] U.S. Cl. ................................ 365/185.09; 365/185.17; 365/185.23; 365/230.06; 365/200
[58] Field of Search .................... 365/185.09, 185.17, 365/185.23, 185.33, 200, 230.06

[56] References Cited

U.S. PATENT DOCUMENTS 5,233,559   8/1993   Brennan, Jr. .................... 365/185.09

*Primary Examiner*—David C. Nelms
*Assistant Examiner*—Trong Pham
*Attorney, Agent, or Firm*—Robby T. Holland; Richard L. Donaldson

[57] ABSTRACT

During the preconditioning of word lines (19) of a memory array (10), Each nondefective word line (19) is fired, one at a time, to raise the turn-on voltage of the word line. After each nondefective word line (19) has been fired, physically adjacent word line groupings (35) are fired simultaneously without regard to the presence of defective word lines (19).

19 Claims, 3 Drawing Sheets

CIRCUIT AND METHOD FOR PRECONDITIONING MEMORY WORD LINES ACROSS WORD LINE BOUNDARIES

TECHNICAL FIELD OF THE INVENTION

This invention relates in general to the field of memory devices, and more particularly to a circuit and method for preconditioning the word lines of flash memory devices.

BACKGROUND OF THE INVENTION

Flash memory devices are comprised of an array of memory cells, each memory cell being intersected by a word line, sometimes referred to as a row line, and a bit line, sometimes referred to as a column line. Each memory cell may be comprised of a MOS transistor with a control gate and a floating gate. Before a memory cell is programmed, no excess charge exists on the gate of the transistor. As a result, the turn-on voltage of the transistor, $V_T$ is low, and the memory cell may be arbitrarily considered a logical 1. Once the memory cell is programmed by the application of a high voltage to the drain and gate of the transistor, a stored charge accumulates on the floating gate of the transistor, raising the turn-on voltage of the transistor. A programmed memory cell may be arbitrarily considered a logical 0. Erasing or deprogramming a programmed cell involves grounding or applying a negative potential to the control gate and applying an operating voltage to the source of the transistor.

As part of an erase step, each word line in the flash memory device must be preconditioned. Preconditioning is necessary to assure that the turn-on voltage of each cell is uniformly high. During the preconditioning step, the turn-on voltage of each cell is raised so that each cell has roughly the same turn-on voltage.

Because of manufacturing defects a number of word lines of the memory array will be defective. The memory cells in defective rows may have turn-on voltages that are at or below zero. These defective rows and columns can be mapped out of the array of memory cells by replacing the defective rows or columns with redundant rows or columns. Even though defective word lines are mapped out of the memory array, the defective word lines will still physically intersect with good (nondefective) bit lines. The intersection of a defective word line and a good bit line may interfere with a READ operation of nondefective memory cells on the bit line. For example, during a READ operation, if the target cell is a logical 0, i.e., having a high turn-on voltage, and if the defective cell on the bit line has a turn-on voltage at or below zero volts, the sense amplifier will sense the sinking of current by the defective cell. The sense amplifier will then output a logical 1 rather than a logical 0.

As part of the preconditioning step, a conventional strategy for avoiding interference by memory cells in defective rows involves setting the turn-on voltage of memory cells on the defective rows to a high level, thereby preventing these cells from being turned on and sinking current during operation of the flash memory device. To accomplish this, a high voltage, typically 12 volts or more, is applied to the word line and a second voltage, typically 6 volts, is applied to the bit line. The array voltage source, which may be connected to the source of each transistor, is grounded. The remaining word lines are shorted to ground. As a result, the memory cells on the defective row are programmed, resulting in a high turn-on voltage for each transistor in the defective row.

One type of defect occurs when adjacent word lines are shorted together. When adjacent word lines are shorted together, the high voltage applied to the defective word line during preconditioning will be pulled to ground by the ground path through the adjacent shorted defective word line.

In some cases, word lines are shorted across a word line boundary, indicating that a word line in a grouping of eight word lines is shorted to an adjacent word line in a grouping of eight word lines. In this scenario, when a high voltage is applied to a defective word line, the applied voltage may find a path to ground through a shorted word line that is across a word line boundary separating groupings of eight word lines.

SUMMARY OF THE INVENTION

In accordance with the present invention, a circuit and method for preconditioning word lines in flash memory devices is provided that substantially reduces or eliminates the problems and disadvantages of prior methods of preconditioning word lines in flash memory devices.

The circuitry and method of the present invention includes a flash memory device having a number of word lines. During the preconditioning step, the word lines are preconditioned in two substeps. Each nondefective word line is fired, one at a time, to raise the turn-on voltage of the word line. After each nondefective word line has been fired, each word line in a grouping of eight or sixteen word lines is fired simultaneously.

A technical advantage of the present invention is the provision of a circuit and method for preconditioning defective word lines that are shorted across word line groupings of eight or sixteen word lines.

A further technical advantage of the present invention is the provision of a circuit and method for preconditioning word lines in which the nondefective word lines may first be preconditioned and defective word lines may later be preconditioned without affecting the successful preconditioning of the nondefective word lines.

BRIEF DESCRIPTION OF THE DRAWINGS

A more complete understanding of the present invention and advantages thereof may be acquired by referring to the following description taken in conjunction with the accompanying drawing in which like reference numbers indicate like features, and wherein.

DETAILED DESCRIPTION OF THE INVENTION

Figure 1:
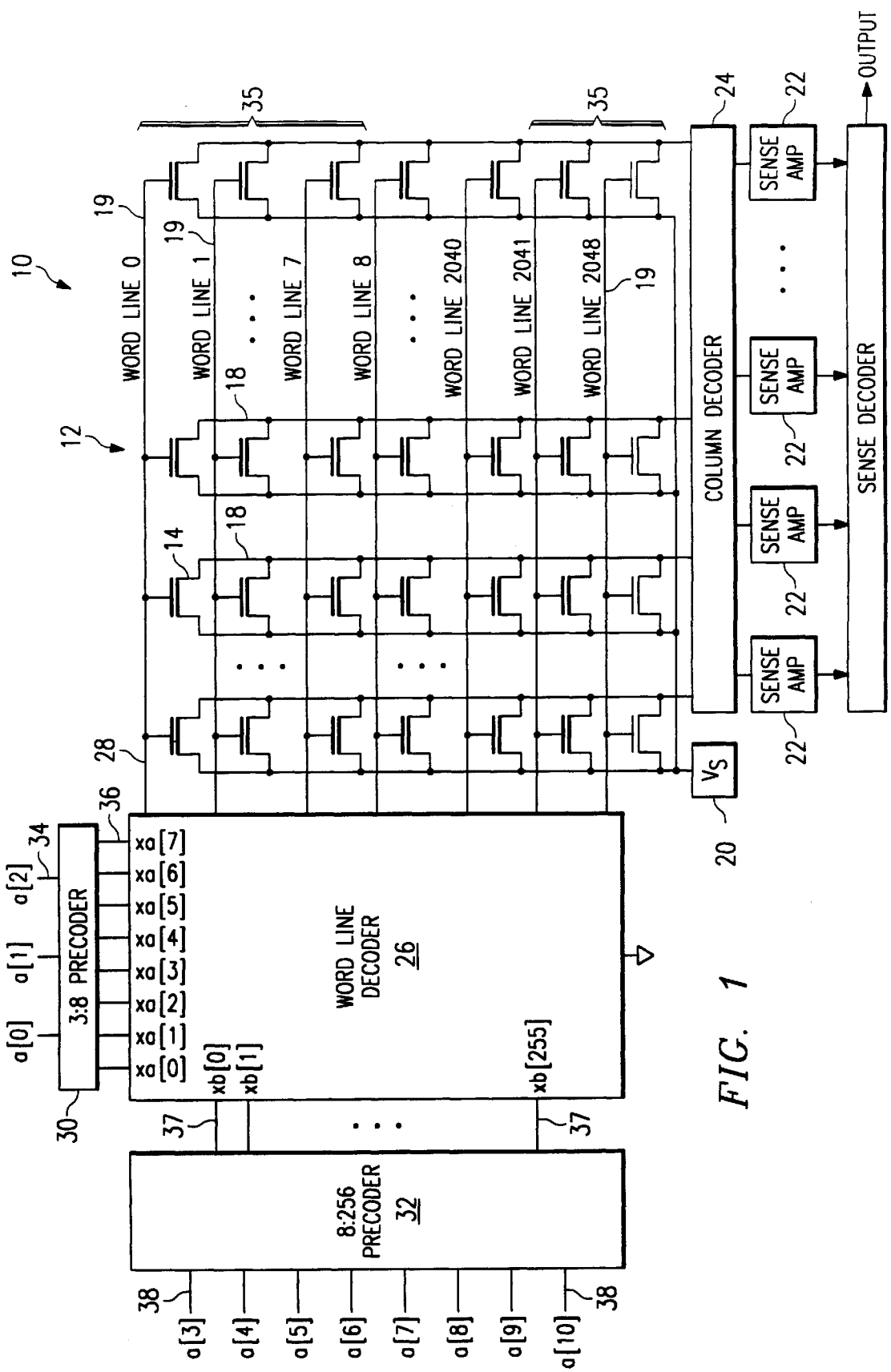
FIG. 1 is a diagram of the memory array of the present invention.

Referring to FIG. 1, one embodiment of a flash memory device, indicated generally at 10, is shown. Although FIG. 1 is an illustration of a flash memory device, the teachings of the present invention are not limited to flash memory devices but are also applicable to semiconductor memory devices generally.

Flash memory device 10 includes an array of memory cells 12. Each memory cell 12 may comprise a floating gate avalanche MOS (FAMOS) transistor 14 located at the intersection of a word line 19 and a bit line 18. The gate of each transistor 14 is connected to a word line 19, as shown. The source of each transistor 14 is coupled to an array power supply 20, and the drain of each transistor 14 is coupled to a bit line 18. Array source 20 is 0 volts during READ and programming step and typically 6 volts during an ERASE step. Each bit line 18 terminates in a column decoder 24, the multiple outputs of which are provided to a plurality of sense amplifiers 22. The output of sense amplifiers 22 is provided to an output circuit 25. The output for a READ operation is the logical value stored in the memory cell being read. The flash memory device of FIG. 1 has 2048 word lines, but may have more or fewer word lines depending on the memory capacity of the memory device.

Each word line 19 is coupled to a word line decoder and driver circuit 26. The outputs 28 of word line decoder 26 comprise 2048 word lines 19 and a number of redundant word lines (not shown) of flash memory device 10. The redundant word lines serve as replacements for word lines that have manufacturing defects. Each word line 19 is tested following manufacture, and those word lines that are found to be defective are logically mapped out of the memory array. A redundant word line is logically mapped into the memory array to take the place of the defective word line. During preconditioning, precoder 26 operates to apply a high voltage to each word line 19 being preconditioned. The word line preconditioning step raises the turn-on voltage of each transistor 14 in the defective row, thereby preventing each transistor 14 from turning on at zero voltage and sinking current during a READ operation.

As shown in the embodiment of the invention of FIG. 1, decoder 26 has 2048 outputs 28, each comprising a word line 19. Decoder 26 has two sets of inputs. A first set of inputs is coupled to decoder 26 from a three to eight [3:8] line precoder 30, and a second set of inputs coupled to decoder 26 from an eight to 256 [8:256] line precoder 32. Precoder 30 has three logical inputs 34: a[0], a[1], and a[2], each of which may be either a logical high or a logical low. Precoder 30 has eight precoder outputs 36, each of which may be either a logical high or a logical low. Precoder outputs 36 are labeled xa[0] through xa[7].

Precoder 32 has eight logical inputs 38: a[3], a[4], a[5], a[6], a[7], a[8], a[9], and a[10], each of which may be either a logical high or a logical low. Precoder 32 has 256 precoder outputs 37, each of which may be either a logical high or a logical low, and each of which is coupled to the input of word line decoder 26. Precoder outputs 35 are labeled xb[0] through xb[255].

In operation, when a voltage is to be applied to a single word line 19, precoder 32 applies a logical high to one of the 256 precoder output lines 37 on the basis of the logic states of input lines 38. To complete the selection of a single word line 19, precoder 30 selects one of precoder output lines 36 based on the logic states of input lines 34. Decoder 26 interprets the logic states of precoder output lines 37 and 36 and applies a voltage to one or more of the 2048 word lines 19.

Each precoder output line 37 is logically associated with a grouping 35 of eight word lines 19. The word lines 19 in the word line grouping 35 are adjacent one another. As an example, word line 0 through word line 7 are a grouping 35 of eight word lines that is logically coupled to precoder output word line xb[0]. Word line 2041 through word line 2048 comprise a grouping 35 of word lines 19 that is logically coupled to precoder output word line xb[255]. Each word line grouping 35 is adjacent one or more other word line groupings 35. The word line grouping 35 associated with precoder output word line xb[0] is adjacent with the word line grouping 35 associated with precoder output line xb[1]. A word line boundary separates each of these word line groupings 35.

Depending on the logic states of the precoder output lines 36, decoder 26 applies a high voltage to one or more of the eight word lines 19 logically associated with the energized precoder output line 37. As an example, if all eight precoder output lines 36 are HIGH, decoder 26 applies a voltage to all eight word lines 19 in the word line grouping 35 associated with the selected precoder output line 37. Assuming that xb[0] is HIGH, for example, and each of xa[0] through xa[7] are HIGH, then a voltage is applied to each of word lines 0 through 7. If only one of the eight precoder output lines is HIGH, decoder 26 applies a HIGH voltage to the single word line 19 selected from among the eight word lines 19 in word line grouping 35 associated with the selected precoder output line 37.

Figure 2:
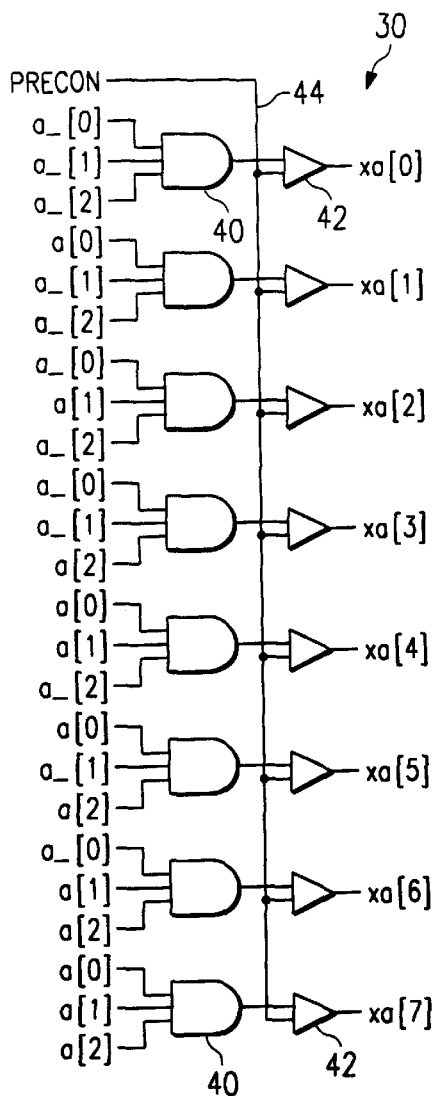
FIG. 2 is a diagram of the logic circuitry of the 3:8 precoder circuit of the present invention.

Referring to FIG. 2, the internal logic of precoder 30 is shown in more detail. Precoder 30 has eight AND gates 40. Each AND gate 40 able to pass a logical high voltage upon the application of a unique combination of logical inputs a[0], a[1], and a[2]. The output of each AND gate is coupled to the input of one of eight OR gates 42. Each OR gate 42 has two inputs, the other being PRECON line 44. The operation of PRECON line 44 will be explained more fully below. The output of each OR gate is coupled to precoder output lines 36. In operation, for example, if inputs a[0] and a[1] are at a logical low and input a[2] is at a logical high, the AND gate 40 preceding precoder output line xa[3] outputs a logical high to the input of OR gate 42, which likewise outputs a logical high to precoder output line xa[3].

Figure 3:
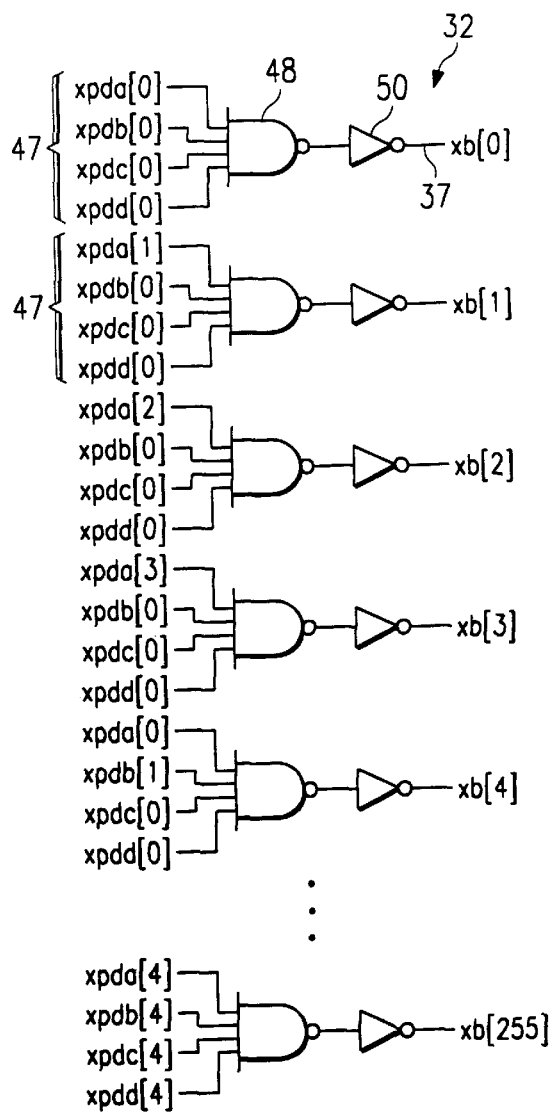
FIG. 3 is a diagram of the logic circuitry of the output stage of the 8:256 precoder circuit of the present invention.

Referring to FIG. 3, the internal logic of precoder 32 is shown in more detail. The output stage of precoder 32 includes 256 logic circuits 47, each comprising a NAND gate 48 and an inverter 50. The output of each logic circuit 47 is coupled to a precoder output line 37. Each logic circuit 47 is associated with a unique grouping of eight word lines 19. In the embodiment of FIG. 3, each NAND gate 48 has four inputs, each input being a unique combination of one of xpda[1, 2, 3, or 4], xpdb[1, 2, 3, or 4], xpdc[1, 2, 3, or 4], and xpdd[1, 2, 3, or 4], each which may be a logical high or logical low. The input of each of NAND gates 48 is a unique combination of The output of logic circuit 47 is only HIGH if each of the four inputs of NAND gate 48 is HIGH.

Figure 4:
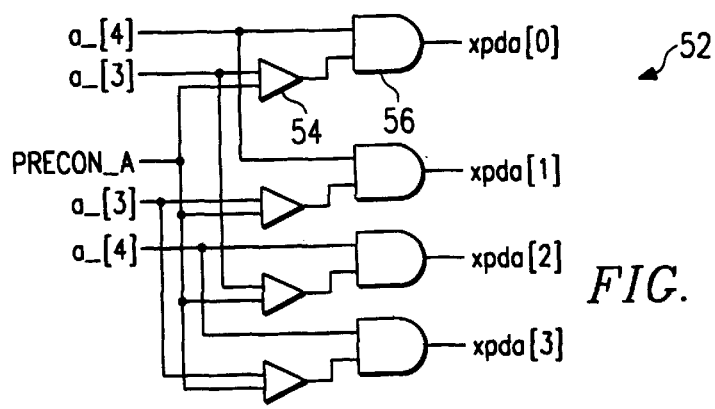
FIG. 4 is a diagram of one of four logic circuits of the 8:256 precoder circuit of the present invention.

Referring to FIG. 4, the logic value of each of xpda[1], xpda[2], xpda[3], and xpda[4] is determined by the logic states of precoder inputs a[3] and a[4]. Precoder inputs a[3] and a[4] are inputs to logic circuit 52. The outputs of logic circuit 52 are xpda[1], xpda[2], xpda[3], and xpda[4]. Logic circuit 52 also includes input line PRECON_A, whose function will be explained more fully below. Logic circuit 52 includes OR gates 54 and AND gates 56. Input a_[4], representing a logical inverse of a[4] is coupled to the inputs of AND gates 56 preceding xpda[0] and xpda[1], and input a_[3], representing a logical inverse of a[3], is coupled to the inputs of OR gates 54 preceding xpda[0] and xpda[2]. Input a[3] is coupled to the input of OR gates 54 preceding xpda[1] and xpda[3], and input a[4] is coupled to the input of AND gates 56 preceding xpda[2] and xpda[3]. As an example of the operation of logic circuit 52, if input a[3] is a logical high and input a[4] is a logical low, xpda[1] is HIGH and xpda[0], xpda[2], and xpda[3] are LOW. In this example, because a[3] is HIGH, the OR gate 54 preceding xpda[1] outputs a logical high to AND gate 56. The second input to AND gate 56 is a_[4], which is also HIGH, resulting in a logical high at xpda[1].

Figure 5:
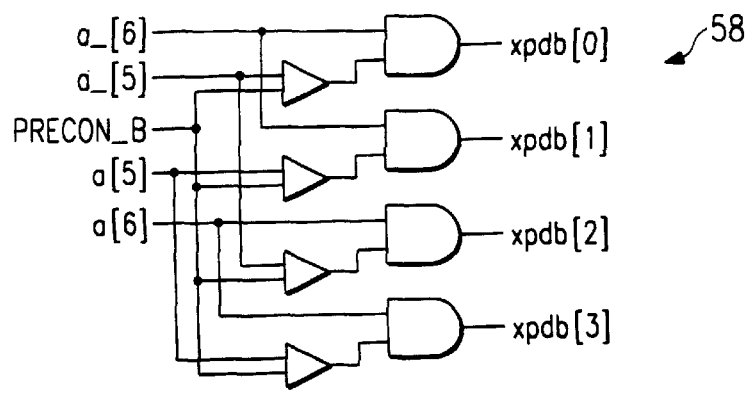
FIG. 5 is a diagram of one of four logic circuits of the 8:256 precoder circuit of the present invention.
Figure 6:
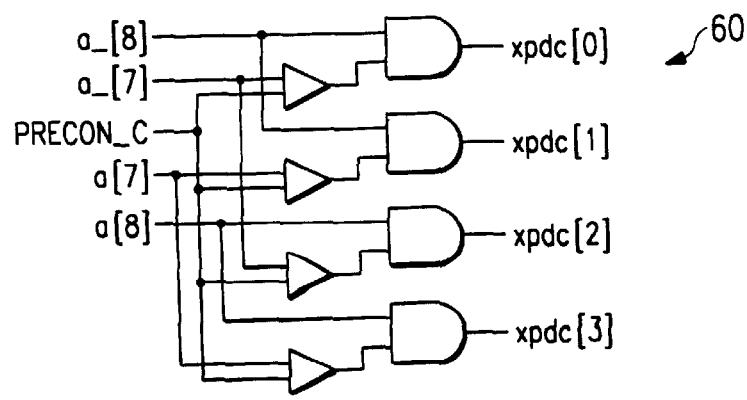
FIG. 6 is a diagram of one of four logic circuits of the 8:256 precoder circuit of the present invention.
Figure 7:
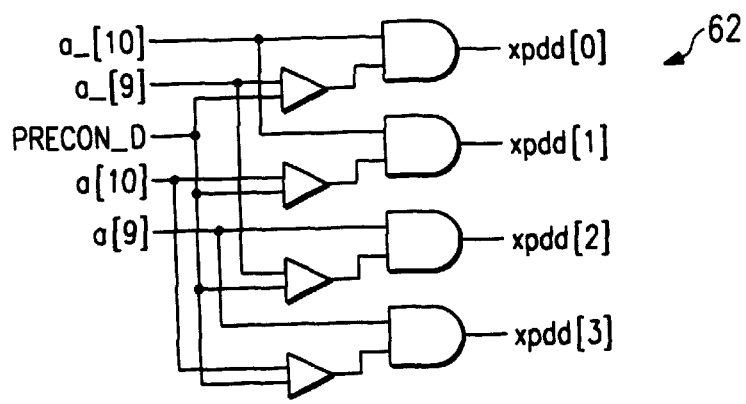
FIG. 7 is a diagram of one of four logic circuits of the 8:256 precoder circuit of the present invention.

In a similar fashion, as shown in FIG. 5, inputs a[5] and a[6] provide the inputs for a similar logic circuit 58, providing as an output the logic value for xpdb[0], xpdb[1], xpdb[2], and xpdb[3]. Logic circuit 58 includes input line PRECON__B. Referring to FIG. 6, inputs a[7] and a[8] provide the inputs for a similar logic circuit 60, providing as an output the logic value for xpdc[0], xpdc[1], xpdc[2], and xpdc[3]. Logic circuit 60 includes input line PRECON__C. Referring to FIG. 7, inputs a[9] and a[10] provide the inputs for a similar logic circuit 62, providing as an output the logic value for xpdd[0], xpdd[1], xpdd[2], and xpdd[3]. Logic circuit 62 includes input line PRECON__D.

According to one embodiment of the present invention, the preconditioning of the word lines 19 of memory device 10 is accomplished by individually preconditioning each of the non-defective word lines 19, including the redundant word lines (not shown) that have replaced defective word lines. During this step, logic input line PRECON in precoder 30 and each of input lines PRECON__A, PRECON__B, PRECON__C, and PRECON__D in logic circuits 52, 58, 60, and 62, respectively, are held LOW. Referring to FIG. 2, when input PRECON in precoder 30 is LOW, each of decoder output x[0] through x[7] only goes HIGH if the output of the AND gate 40 preceding each of the respective decoder outputs x[0] through x[7] is HIGH. In the case of logic circuit 52 of FIG. 4, for example, when PRECON__A is held LOW, each of OR gates 54 has a logical low as one of its two inputs, resulting in a circuit in which OR gates 54 will output a logical high only if the other input of OR gate 54 is HIGH. Each word line 19 not being preconditioned is shorted to ground.

After each nondefective word line 19 of memory device 10 is individually preconditioned, defective word lines 19, including shorted word lines, are preconditioned. According to one embodiment of the present invention, to precondition defective word lines, sixteen mutually adjacent word lines, comprising two adjacent groupings 35 of word lines, are simultaneously preconditioned without regard for the presence of defective word lines. The sixteen word lines that are simultaneously preconditioned extend across a word line boundary, which separates each word line grouping 35.

As an example of the simultaneous preconditioning of adjacent word line groupings 35, PRECON__A of logic circuit 52 of FIG. 4 is set HIGH, thereby applying a logical high to the input of each OR gate 54, which in turn outputs a logical high to the input of each AND gate 56. While PRECON__A is HIGH, PRECON__B, PRECON__C, and PRECON__D are held LOW. If a[4] is held LOW, a logical high is applied to the inputs of AND gates 56 coupled to a_[4], setting both xpda[0] and xpda[1] to HIGH. During this period, input line PRECON of decoder 32 is held HIGH, thereby applying a HIGH voltage to an input of each of OR gates 42 and setting each of xa[0] through xa[7] to HIGH. Meanwhile, the combination of a[5], a[6], a[7], a[8], a[9], and a[10] cycle through their available logic states while PRECON__A and PRECON and held HIGH and a_[4] is held LOW. In this scenario, referring to logic circuits 47 of FIG. 3, in those instances in which xpda[0] and xpda[1] are in physically adjacent logic circuits 47 in output state 46, each set of the sixteen word lines 19 associated with these logic circuits 64 will be set to a logical high simultaneously.

Because the turn-on voltages of the nondefective word lines 19 were previously raised during the individual preconditioning of the nondefective word lines 19, the nondefective word lines 19 will not sink current during the simultaneous preconditioning of defective word lines. During the simultaneous preconditioning of sixteen adjacent word lines, a HIGH voltage will be simultaneously applied to all defective word lines in the group of sixteen that are shorted together, thereby preventing applied voltage from escaping to ground during preconditioning. Likewise, a HIGH voltage will be simultaneously applied to defective word lines that are shorted across a grouping 35 of eight word lines 19. Assuming, for example, that word line 7 is shorted to word line 8, the application of simultaneous HIGH voltage to each of word lines 1 through 19 will precondition word lines 7 and 8, while preventing the applied voltage from reaching a path to ground.

To simultaneously precondition the sets of sixteen word lines 19 associated with logic circuits 47 in which xpda[2] and xpda[3] are inputs to adjacent logic circuits 47, input lines PRECON AND PRECON__A remain HIGH, PRECON__B, PRECON__C, and PRECON__D remain LOW, and a[4] is set to a logical high. The combination of a[5] through a[10] cycles through the available logic combinations. For those instances in which xpda[2] and xpda[3] are in inputs to adjacent logic circuits 47 in precoder 32, each set of sixteen word lines 19 associated with these logic circuits 47 will be set to a logical high and simultaneously preconditioned.

This process is continued by setting PRECON and PRECON__B of logic circuit 58 to HIGH, setting PRECON__A, PRECON__C, and PRECON__D to LOW, and cycling through the available combinations of a[3], a[4], a[7], a[8], a[9], and a[10] while a[6] is set LOW, and then repeating the foregoing with a[6] set to HIGH. In this scenario, for those instances in which xpdb[0] and xpdb[1] or xpdb[2] and xpdb[3] are inputs in adjacent logic circuits 47 in output state 46, each grouping 35 of eight word lines 19 associated with these logic circuits 47 will be set to a logical high and simultaneously preconditioned. This process likewise continues in logic circuits 60 and 62 to simultaneously precondition word line groupings 35 associated with xpdc[ ] and xpdd[ ], respectively.

According to the teachings of the present invention, adjacent groupings 35 of eight word lines 19 are preconditioned simultaneously, allowing word lines 19 that are shorted across boundaries of eight word lines to be preconditioned simultaneously, thereby eliminating a ground path during preconditioning for those defective word lines shorted across a word line boundary.

The teachings of the present invention are not limited to memory arrays having 2048 word lines. Rather, the teachings of the present invention may be applied to memory arrays having fewer or greater numbers of word lines. Likewise, the teachings of the present invention may be applied to simultaneously precondition groupings of 32 word lines to eliminate word line shorts across boundaries of sixteen word lines.

Although the present invention has been described in detail, it should be understood that various changes, substitutions and alterations can be made thereto without departing from the spirit and scope of the invention as defined by the appended claims.

What is claimed is:

1. A memory device having circuitry for preconditioning word lines, comprising:

a plurality of word lines;

a decoding circuit having a plurality of outputs coupled to the word lines, the decoding circuit able to select one or more of the word lines on the basis of inputs received from a first precoding circuit and a second precoding circuit;

the first precoding circuit including a number of outputs and a number of inputs, one of each of the outputs of the first precoding circuit logically associated with a unique combination of the inputs of the first precoding circuit; and the second precoding circuit including a number of outputs, each of the outputs of the second precoding circuit logically associated with a grouping of the word lines, the number of the word lines in the grouping equal in number to the number of outputs of the first precoding circuit, the second precoding circuit including logic circuitry able to logically activate adjacent groupings of word lines.

2. The memory device of claim 1, wherein the first precoding circuit includes three logical inputs and eight logical outputs.

3. The memory device of claim 1, wherein the first precoding circuit includes three logical inputs, eight logical outputs, and a preconditioning input line, which, when activated, causes each of the eight logical outputs of the first precoding circuit to be at a logical high.

4. The memory device of claim 1, wherein the second precoding circuit comprises:

a plurality of logical inputs;

the plurality of logical inputs separated into subsets of logical inputs, each of the subsets of logical inputs driving a logic circuit;

each of the logic circuits having as inputs two of the logic inputs, four logical output lines, and a preconditioning input line, which, when activated, causes the logic circuit to output a logical high on two of the four logical output lines.

5. The memory device of claim 1, wherein the second precoding circuit comprises:

eight logical inputs;

four logic circuits, each logic circuit having as inputs two of the eight logical inputs of the second precoding circuit;

each of the logic circuits having four logical output lines, and a preconditioning input line, which, when activated, causes the logic circuit to output a logical high on two of the four logical output lines.

6. The memory device of claim 1, wherein the first precoding circuit comprises,
three logical inputs, eight logical outputs, and a preconditioning input line, which, when activated, causes each of the eight logical outputs of the first precoding circuit to be at a logical high; and wherein the second precoding circuit comprises,
eight logical inputs;
four logic circuits, each logic circuit having as inputs two of the eight logical inputs of the second precoding circuit;
each of the logic circuits of the second precoding circuit having four logical output lines, and a preconditioning input line, which, when activated, causes the logic circuit to output a logical high on two of the four logical output lines of the second precoding circuit.

7. The memory device of claim 1, wherein the first precoding circuit comprises,
three logical inputs, eight logical outputs, and a preconditioning input line, which, when activated, causes each of the eight logical outputs of the first precoding circuit to be at a logical high; and wherein the second precoding circuit comprises,
a plurality of logical inputs;
the plurality of logical inputs separated into subsets of logical inputs, each of the subsets of logical inputs driving a logic circuit of the second precoding circuit;
each of the logic circuits having as inputs two of the logical inputs of the second precoding circuit, four logical output lines, and a preconditioning input line, which, when activated, causes the logic circuit to output a logical high on two of the four logical output lines.

8. A circuit for preconditioning word lines of a memory array, comprising:

a decoding circuit;

a first precoding circuit having a plurality of outputs coupled to the decoding circuit;

a second precoding circuit having a plurality of outputs coupled to the decoding circuit;

the second precoding input having a preconditioning input line, which, when activated, causes the second precoding circuit to apply a voltage to two physically adjacent sets of outputs;

the first precoding circuit having a preconditioning input line, which when activated, causes the first precoding circuit to apply a voltage to each of its outputs; and wherein the decoding circuit passes a voltage to the word lines of the memory array on the basis of the outputs of the first precoding circuit and the second precoding circuit such that the voltage passed is applied to two adjacent groupings of word lines simultaneously during preconditioning of the memory array.

9. The circuit of claim 8, wherein the first precoding circuit comprises eight logical outputs, and three logical inputs.

10. The circuit of claim 9, wherein the second precoding circuit comprises ten logical inputs, and 256 logical outputs.

11. The circuit of claim 10, wherein the decoding circuit passes a voltage to the word lines of the memory array on the basis of the outputs of the first precoding circuit and the second precoding circuit such that the voltage passed is applied to two adjacent groupings of word lines simultaneously during preconditioning of the memory array, the groupings of word lines comprising eight word lines.

12. A method for preconditioning word lines of a memory array, comprising the steps of:

serially applying an elevated voltage to all nondefective word lines; and simultaneously applying an elevated voltage to physically adjacent groupings of word lines without regard to the presence of defective word lines within the grouping of physically adjacent word lines.

13. The method of claim 12, wherein the step of serially applying an elevated voltage to all nondefective word lines includes the step of serially applying an elevated voltage to all nondefective word lines, including redundant word lines mapped into the memory array to replace defective word lines.

14. The method of claim 12, wherein the step of simultaneously applying an elevated voltage to physically adjacent groupings of word lines comprises the step of simultaneously applying an elevated voltage to two physically adjacent groupings of word lines, each grouping of word lines comprising eight physically adjacent word lines.

15. The method of claim 12, wherein the step of simultaneously applying an elevated voltage to physically adjacent groupings of word lines comprises the step of simultaneously applying an elevated voltage to multiple sets of physically adjacent groupings of word lines such that an elevated voltage has been applied at least once to each word line grouping.

16. The method of claim 12,
    wherein the step of serially applying an elevated voltage to all nondefective word lines includes the step of serially applying an elevated voltage to all nondefective word lines, including redundant word lines mapped into the memory array to replace defective word lines; and
    wherein the step of simultaneously applying an elevated voltage to physically adjacent groupings of word lines comprises the step of simultaneously applying an elevated voltage to two physically adjacent groupings of word lines, each grouping of word lines comprising eight physically adjacent word lines.

17. The method of claim 12,
    wherein the step of serially applying an elevated voltage to all nondefective word lines includes the step of serially applying an elevated voltage to all nondefective word lines, including redundant word lines mapped into the memory array to replace defective word lines; and
    wherein the step of simultaneously applying an elevated voltage to physically adjacent groupings of word lines comprises the step of simultaneously applying an elevated voltage to multiple sets of physically adjacent groupings of word lines such that an elevated voltage has been applied at least once to each word line grouping.

18. The method of claim 12, wherein the step of simultaneously applying an elevated voltage to physically adjacent groupings of word lines comprises the step of simultaneously applying an elevated voltage to two physically adjacent groupings of word lines, each grouping of word lines comprising sixteen physically adjacent word lines.

19. The method of claim 12,
    wherein the step of serially applying an elevated voltage to all nondefective word lines includes the step of serially applying an elevated voltage to all nondefective word lines, including redundant word lines mapped into the memory array to replace defective word lines; and
    wherein the step of simultaneously applying an elevated voltage to physically adjacent groupings of word lines comprises the step of simultaneously applying an elevated voltage to two physically adjacent groupings of word lines, each grouping of word lines comprising sixteen physically adjacent word lines.

* * * * *